（12）United States Patent
Schubert et al.

(10) Patent No.: US 12,266,739 B2
(45) Date of Patent: Apr. 1, 2025

(54) SOLID STATE TRANSDUCER DIES HAVING REFLECTIVE FEATURES OVER CONTACTS AND ASSOCIATED SYSTEMS AND METHODS

(71) Applicant: Micron Technology, Inc., Boise, ID (US)

(72) Inventors: Martin F. Schubert, Mountain View, CA (US); Vladimir Odnoblyudov, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/401,212

(22) Filed: Dec. 29, 2023

(65) Prior Publication Data

US 2024/0136473 A1    Apr. 25, 2024

Related U.S. Application Data

(60) Continuation of application No. 16/673,092, filed on Nov. 4, 2019, now Pat. No. 11,862,756, which is a continuation of application No. 15/910,994, filed on Mar. 2, 2018, now Pat. No. 10,553,760, which is a continuation of application No. 15/269,302, filed on Sep. 19, 2016, now Pat. No. 9,911,903, which is a division of application No. 13/482,176, filed on May 29, 2012, now Pat. No. 9,450,152.

(51) Int. Cl.
*H01L 33/40* (2010.01)
*H01L 33/06* (2010.01)
*H01L 33/32* (2010.01)
*H01L 33/38* (2010.01)
*H01L 33/50* (2010.01)
*H01L 33/58* (2010.01)

(52) U.S. Cl.
CPC ............ *H01L 33/405* (2013.01); *H01L 33/06* (2013.01); *H01L 33/32* (2013.01); *H01L 33/502* (2013.01); *H01L 33/58* (2013.01); *H01L 33/382* (2013.01); *H01L 2933/0016* (2013.01)

(58) Field of Classification Search
CPC ............................ H01L 33/382; H01L 33/405
See application file for complete search history.

(56) References Cited

U.S. PATENT DOCUMENTS

| | | | |
|---|---|---|---|
| 5,288,664 A | 2/1994 | Mukai et al. | |
| 6,028,323 A | 2/2000 | Liu et al. | |
| 6,172,382 B1 | 1/2001 | Nagahama et al. | |
| 6,456,638 B1 | 9/2002 | Fukunaga et al. | |
| 6,526,083 B1 | 2/2003 | Kneissl et al. | |
| 6,620,643 B1 | 9/2003 | Koike et al. | |
| 6,800,500 B2 | 10/2004 | Coman et al. | |

(Continued)

FOREIGN PATENT DOCUMENTS

EP    2590235    5/2013

*Primary Examiner* — John P. Dulka
(74) *Attorney, Agent, or Firm* — Perkins Coie LLP (57) ABSTRACT

Systems and methods for improved light emitting efficiency of a solid state transducer (SST), for example light emitting diodes (LED), are disclosed. One embodiment of an SST die in accordance with the technology includes a reflective material disposed over electrical connectors on a front side of the die. The reflective material has a higher reflectivity than a base material of the connectors such that light traveling toward the connectors reflects back out of the device.

16 Claims, 8 Drawing Sheets

(56) References Cited

U.S. PATENT DOCUMENTS

| | | |
|---|---|---|
| 6,955,936 B2 | 10/2005 | Uemura et al. |
| 6,998,649 B2 | 2/2006 | Hata et al. |
| 7,465,592 B2 | 12/2008 | Yoo |
| 7,498,611 B2 | 3/2009 | Eitoh et al. |
| 7,541,206 B2 | 6/2009 | Yoon et al. |
| 7,675,075 B2 | 3/2010 | Nagai |
| 7,737,459 B2 | 6/2010 | Edmond et al. |
| 7,795,623 B2 | 9/2010 | Emerson et al. |
| 8,004,001 B2 | 8/2011 | Yuan et al. |
| 8,101,965 B2 | 1/2012 | Kim et al. |
| 8,106,412 B2 | 1/2012 | Takao et al. |
| 8,173,456 B2 | 5/2012 | Tsay et al. |
| 8,236,585 B2 | 8/2012 | Yoo et al. |
| 8,318,519 B2 | 11/2012 | Doan et al. |
| 8,334,153 B2 | 12/2012 | Gotoda et al. |
| 8,471,241 B2 | 6/2013 | Choi et al. |
| 8,518,276 B2 | 8/2013 | Striemer et al. |
| 8,581,276 B2 | 11/2013 | Lee et al. |
| 8,624,283 B2 | 1/2014 | Kim |
| 8,624,482 B2 | 1/2014 | Lin |
| 8,653,547 B2 | 2/2014 | Jeong et al. |
| 8,686,429 B2 | 4/2014 | Bergmann et al. |
| 8,686,430 B2 | 4/2014 | Chen |
| 8,835,954 B2 | 9/2014 | Fujimoto et al. |
| 8,872,209 B2 | 10/2014 | Maute et al. |
| 9,018,657 B2 | 4/2015 | Okabe et al. |
| 9,419,182 B2 | 8/2016 | Schubert et al. |
| 9,450,152 B2 | 9/2016 | Schubert et al. |
| 9,911,903 B2 | 3/2018 | Schubert et al. |
| 2001/0042866 A1 | 11/2001 | Coman et al. |
| 2002/0093023 A1 | 7/2002 | Camras et al. |
| 2003/0080344 A1 | 5/2003 | Yoo et al. |
| 2003/0116767 A1 | 6/2003 | Kneissl et al. |
| 2004/0099869 A1 | 5/2004 | Gaska et al. |
| 2005/0067625 A1 | 3/2005 | Hata et al. |
| 2005/0093002 A1 | 5/2005 | Tsai et al. |
| 2006/0033113 A1 | 2/2006 | Lee et al. |
| 2006/0071226 A1 | 4/2006 | Kojima et al. |
| 2006/0071230 A1 | 4/2006 | Lee et al. |
| 2006/0105542 A1 | 5/2006 | Yoo et al. |
| 2006/0154393 A1 | 7/2006 | Doan et al. |
| 2006/0163586 A1 | 7/2006 | Denbaars et al. |
| 2006/0204650 A1 | 9/2006 | Hu et al. |
| 2007/0001181 A1 | 1/2007 | Chen et al. |
| 2007/0010157 A1 | 1/2007 | Sorg et al. |
| 2007/0096130 A1 | 5/2007 | Schiaffino et al. |
| 2008/0042159 A1 | 2/2008 | Eitoh et al. |
| 2008/0117500 A1 | 5/2008 | Narendran et al. |
| 2008/0185609 A1 | 8/2008 | Kozawa et al. |
| 2008/0273564 A1 | 11/2008 | Wang et al. |
| 2008/0283850 A1 | 11/2008 | Kamei et al. |
| 2008/0315236 A1 | 12/2008 | Lu et al. |
| 2009/0020772 A1 | 1/2009 | Chiu et al. |
| 2009/0095975 A1 | 4/2009 | Shin et al. |
| 2009/0179207 A1 | 7/2009 | Chitnis et al. |
| 2009/0236621 A1 | 9/2009 | Chakraborty |
| 2009/0242924 A1 | 10/2009 | Lin et al. |
| 2009/0242929 A1 | 10/2009 | Lin et al. |
| 2009/0278233 A1 | 11/2009 | Pinnington et al. |
| 2009/0283787 A1 | 11/2009 | Donofrio et al. |
| 2010/0019668 A1 | 1/2010 | Koo et al. |
| 2010/0171135 A1 | 7/2010 | Engl et al. |
| 2010/0213485 A1 | 8/2010 | McKenzie et al. |
| 2010/0308354 A1 | 12/2010 | David et al. |
| 2011/0049555 A1 | 3/2011 | Engl et al. |
| 2011/0073889 A1 | 3/2011 | Sugizaki et al. |
| 2011/0084612 A1 | 4/2011 | Ratcliffe et al. |
| 2011/0089453 A1 | 4/2011 | Min et al. |
| 2011/0097897 A1 | 4/2011 | Tanaka et al. |
| 2011/0101390 A1 | 5/2011 | Engl et al. |
| 2011/0133233 A1 | 6/2011 | Kang et al. |
| 2011/0156064 A1 | 6/2011 | Seo et al. |
| 2011/0180831 A1 | 7/2011 | Song et al. |
| 2011/0204376 A1 | 8/2011 | Su et al. |
| 2011/0220933 A1 | 9/2011 | Gotoda et al. |
| 2011/0220935 A1 | 9/2011 | Gotoda et al. |
| 2011/0220937 A1 | 9/2011 | Jeong et al. |
| 2012/0007101 A1* | 1/2012 | Yang .............. H01L 33/387 |
| | | 438/22 |
| 2012/0007118 A1 | 1/2012 | Choi et al. |
| 2012/0097986 A1* | 4/2012 | Ku .............. H01L 27/15 |
| | | 257/E33.072 |
| 2012/0138986 A1 | 6/2012 | Chung et al. |
| 2012/0146047 A1 | 6/2012 | Kneissl et al. |
| 2012/0147280 A1 | 6/2012 | Osterman et al. |
| 2012/0168803 A1 | 7/2012 | Lee et al. |
| 2012/0267650 A1 | 10/2012 | Schubert et al. |
| 2013/0032846 A1 | 2/2013 | Lin et al. |
| 2013/0043481 A1 | 2/2013 | Shubert |
| 2013/0049059 A1 | 2/2013 | Odnoblyudov et al. |
| 2013/0052759 A1 | 2/2013 | Odnoblyudov et al. |
| 2013/0056745 A1 | 3/2013 | Chen et al. |
| 2013/0113007 A1 | 5/2013 | Choi et al. |
| 2013/0134867 A1 | 5/2013 | Yang et al. |
| 2013/0175560 A1 | 7/2013 | Odnoblyudov et al. |
| 2013/0175562 A1 | 7/2013 | Schubert et al. |
| 2013/0234193 A1 | 9/2013 | Odnoblyudov et al. |
| 2013/0293794 A1 | 11/2013 | Hsiao et al. |
| 2013/0299858 A1 | 11/2013 | Kar et al. |
| 2013/0320370 A1 | 12/2013 | Schubert et al. |
| 2014/0176880 A1 | 6/2014 | Cho et al. |
| 2015/0009451 A1 | 1/2015 | Zhu et al. |
| 2017/0005233 A1 | 1/2017 | Schubert et al. |
| 2018/0190873 A1 | 7/2018 | Schubert et al. |
| 2020/0066939 A1 | 2/2020 | Schubert et al. |

\* cited by examiner

SOLID STATE TRANSDUCER DIES HAVING REFLECTIVE FEATURES OVER CONTACTS AND ASSOCIATED SYSTEMS AND METHODS

CROSS-REFERENCE TO RELATED APPLICATIONS

This application is a continuation of U.S. patent application Ser. No. 16/673,092, filed Nov. 4, 2019, now U.S. Pat. No. 11,862,756; which is a continuation of U.S. patent application Ser. No. 15/910,994, filed Mar. 2, 2018, now U.S. Pat. No. 10,553,760; which is a continuation of U.S. patent application Ser. No. 15/269,302, filed Sep. 19, 2016, now U.S. Pat. No. 9,911,903; which is a divisional of U.S. patent application Ser. No. 13/482,176, filed May 29, 2012, now U.S. Pat. No. 9,450,152; each of which is incorporated herein by reference in its entirety.

TECHNICAL FIELD

The present technology generally relates to solid state transducer (SST) dies having patterned contacts. For example, several embodiments of the present technology are related to improving the light output of a light emitting diode (LED) by reflecting light from contacts located on and/or in the light emitting materials.

BACKGROUND

SST dies are used in a wide variety of products and applications related to emitting and/or sensing radiation. Several types of SST dies that emit electromagnetic radiation in the visible light spectrum are used in mobile phones, personal digital assistants ("PDAs"), digital cameras, MP3 players, computers, tablets, and other portable electronic devices for backlighting and other purposes. SST dies are also used for signage, indoor lighting, outdoor lighting, vehicle lighting, and other types of general illumination.

Figure 1A:
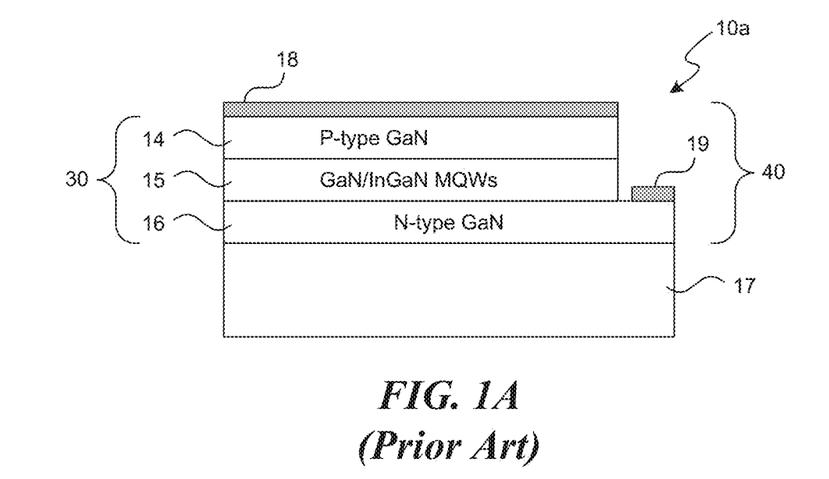
FIG. 1A is a partially schematic, cross-sectional illustration of an SST die having lateral contacts in accordance with the prior art.

FIG. 1A is a cross-sectional view of a conventional SST die 10a having lateral configuration. As shown in FIG. 1A, the SST die 10a includes an SST 40 on a growth substrate 17. The SST 40 can be an LED having a transduction structure 30 comprising an active material 15 between layers of N-type GaN 16 and P-type GaN 14. The active material 15 contains gallium nitride/indium gallium nitride (GaN/InGaN) multiple quantum wells ("MQWs"). The SST 40 also includes a P-type contact 18 on the P-type GaN 14 and an N-type contact 19 on the N-type GaN 16. In operation, electrical power provided to the SST die 10a via the P-type and N-type contacts 18 and 19 causes the active material 15 to emit light.

Figure 1B:
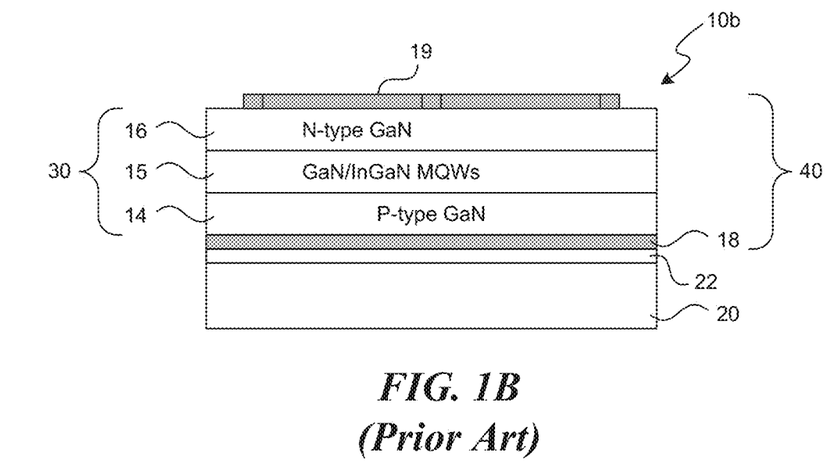
FIG. 1B is a partially schematic, cross-sectional illustration of an SST die having vertical contacts in accordance with the prior art.

FIG. 1B is a cross-sectional view of another conventional SST die 10b in which the P-type and N-type contacts 18 and 19 are in a vertical configuration. During formation of the SST die 10b, the N-type GaN material 16, active material 15 and P-type GaN material 14 are grown on a growth substrate (not shown in FIG. 1B), which can be similar to the growth substrate 17. After forming the transduction structure 30, a carrier 20 is attached to the P-type contact 18. For example, one side of the P-type contact 18 can be attached to the P-type GaN 14 and the other side of the P-type contact 18 can be attached to the carrier 20 using a bond material 22, which can be composed of metal or metal alloy layers. The bond material can be a Ni—Sn—Ni stack such that one Ni layer contacts the carrier 20 and the other Ni layer contacts the P-type contact 18. Other bond materials, such as CuSn and/or TiSi, can be used. Next, the growth substrate can be removed and the N-type contact 19 can be formed on the N-type GaN 16. The structure is then inverted to produce the orientation shown in FIG. 1B.

Figure 2A:
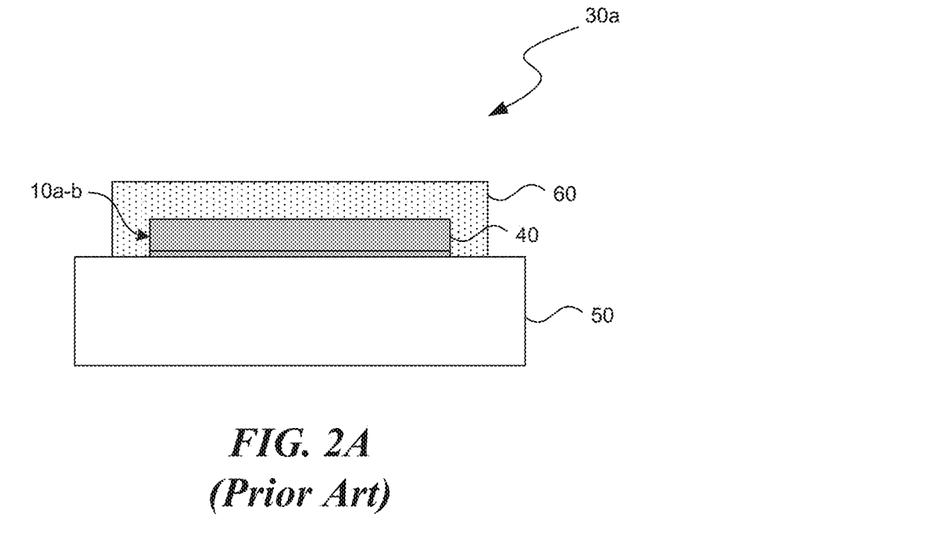
FIG. 2A is a partially schematic, cross-sectional illustration of an SST lighting device having a converter material in accordance with the prior art.

Most electronic devices and many other applications require a white light output. However, true white light LEDs are not available because LEDs typically emit light at only one particular wavelength. For human eyes to perceive the color white, a mixture of wavelengths is needed. One conventional technique for emulating white light with LEDs includes depositing a converter material (e.g., a phosphor) on an LED. For example, FIG. 2A shows a conventional lighting device 30a that includes a device substrate 50, an SST die 10a or 10b mounted on the device substrate 50, and a converter material 60 on the SST die 10a-b. The light emitted from the SST 40 undergoes at least partial conversion while passing through the converter material 60 as explained in more detail below with respect to FIG. 2C.

Figure 2B:
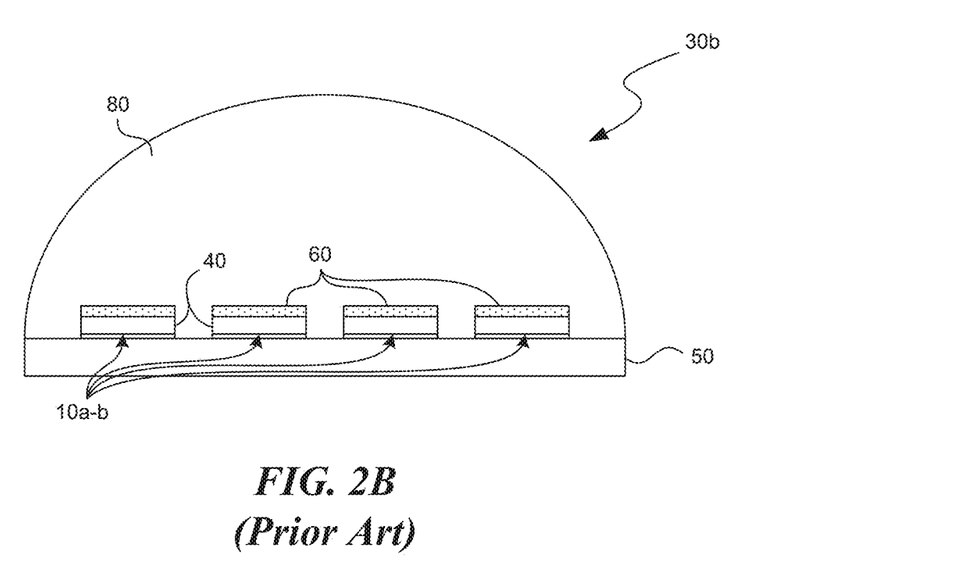
FIG. 2B is a partially schematic cross-sectional illustration of a multi-SST lighting device having a lens in accordance with the prior art.

Multiple SST dies 10a-b can be used in a lighting device. For example, FIG. 2B is a cross-sectional view of a conventional multi-SST lighting device 30b having the device substrate 50, a plurality of SST dies 10a-b attached to the device substrate 50, and the converter material 60 over the SST dies 10a-b. The multi-SST lighting device 30b also has a single lens 80 over the SST dies 10a-b. Other conventional multi-SST lighting devices may have a dedicated lens per SST or a group of SSTs. All the SSTs 40 in the multi-SST lighting device 30b are typically connected to a common anode and cathode such that all of the SST dies 10a-b operate together.

Figure 2C:
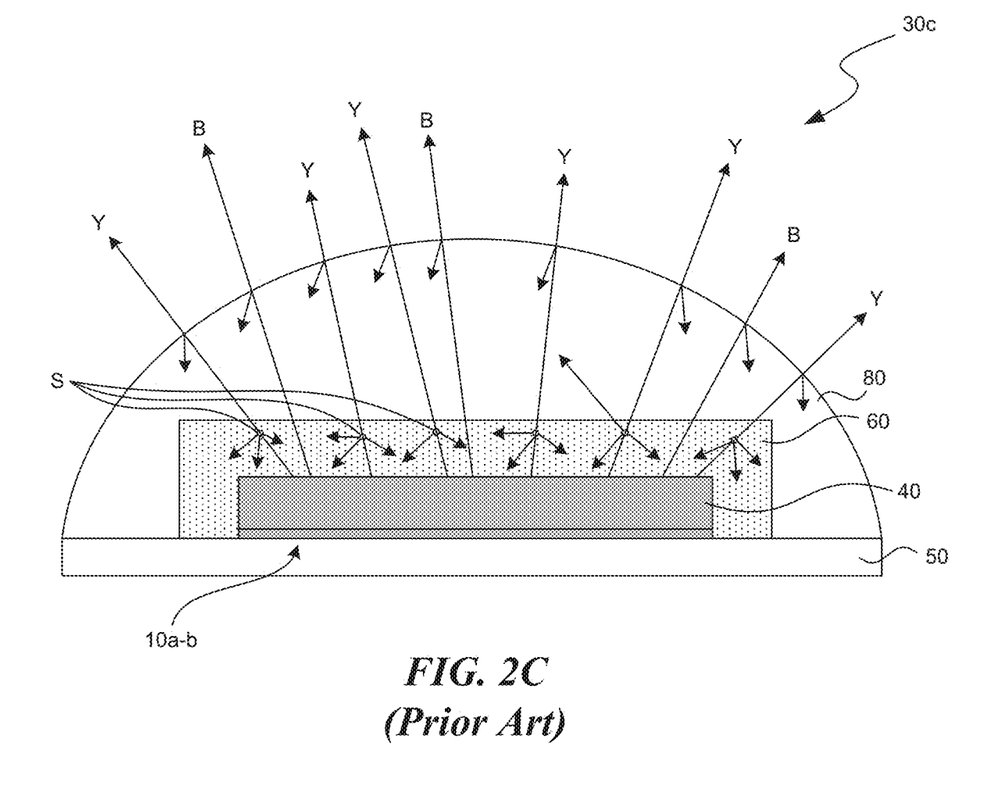
FIG. 2C is a schematic illustration of light refraction and reflection from the converter material and lens in accordance with the prior art.

FIG. 2C schematically illustrates the light frequency conversion and scattering/reflection in a conventional lighting device 30c in which the lens 80 encloses the SST 40 and the converter material 60. The SST 40 emits blue light (B) that can stimulate the converter material 60 to emit light at a different frequency, e.g., yellow light (Y). Some blue light (B) emitted by the SST 40 passes through the converter material without stimulating the converter material 60. Other blue light (B) emitted by the SST 40 stimulates the converter material 60, which, in turn, emits yellow light (Y). The combination of the emissions of blue light (B) from the SST 40 and the emissions of yellow light (Y) from the converter material 60 is designed to appear white to a human eye if the blue and yellow emissions are matched appropriately. However, not all light emitted by the SST 40 ultimately leaves the lighting device 30c. For instance, the converter material 60 scatters some blue light (B) back toward the SST 40. Additionally, some light that reaches the outer edge of the single lens 80 reflects back toward the converter material 60 and further toward the SST 40.

Figure 3A:
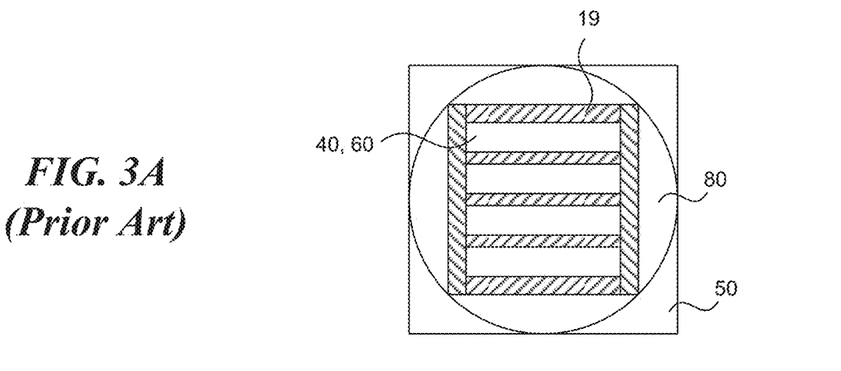
FIGS. 3A-3C are top views schematically illustrating N-contact layouts for SST devices in accordance with the prior art.
Figure 3B:
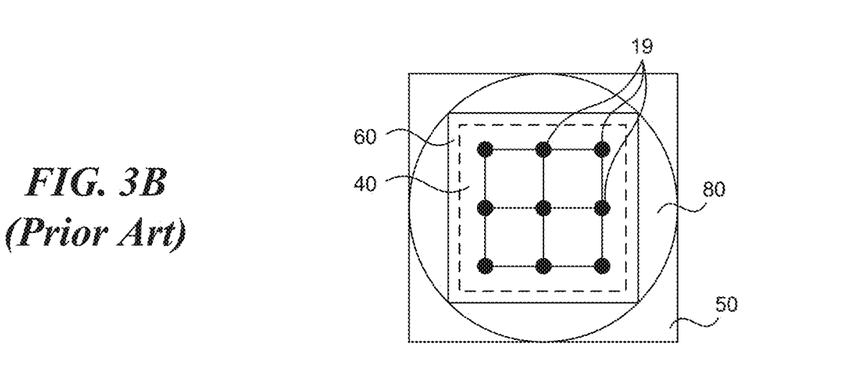
Figure 3C:
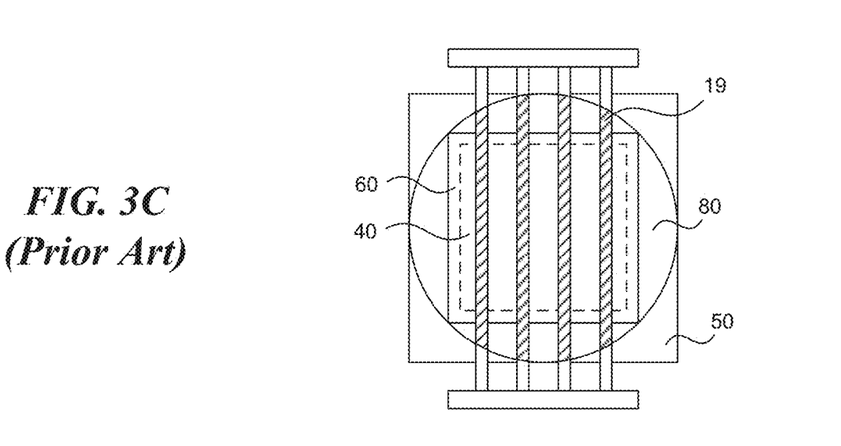

FIGS. 3A-3C show top views of several conventional lighting devices constructed as schematically illustrated in FIGS. 1B and 2A with different patterns of N-type contacts over the N-type GaN of the SSTs 40. The patterns of N-contacts are designed to distribute electrical current through the N-type GaN to other relevant parts of the SST. Some examples of the N-contact patterns are rail-type N-contacts running within the outline of the SST 40 (FIG. 3A), dot-type N-contacts distributed over the SST 40 (FIG. 3B), and rail-type N-contacts extending beyond the outline of the SST 40 (FIG. 3C). The N-contacts 19 can cover an appreciable percentage of the surface area of the SST 40. Since the N-contacts 19 may absorb a significant portion of the light that is scattered from the converter material, refracted from the lens 80, or reflected from other objects (not shown), the N-contacts 19 are relatively "dark regions" on the surface of the SST that reduce the output. Consequently, even though a particular N-contact layout may improve the distribution of electrical current through the SST 40, conventional N-contacts may impair the visual appearance and reduce the efficiency of the device.

BRIEF DESCRIPTION OF THE DRAWINGS

Many aspects of the present disclosure can be better understood with reference to the following drawings. The components in the drawings are not necessarily to scale. Instead, emphasis is placed on clearly illustrating the principles of the present disclosure. Furthermore, in the drawings, like reference numerals designate corresponding parts throughout the several views.

DETAILED DESCRIPTION

Specific details of several embodiments of representative SST dies and associated methods of manufacturing SST dies are described below. The term "SST" generally refers to a solid-state transducer that includes a semiconductor material as an active medium to convert electrical energy into electromagnetic radiation in the visible, ultraviolet, infrared, and/or other spectra. For example, SST dies include solid-state light emitters (e.g., LED dies, laser diodes, etc.) and/or sources of emission other than conventional electrical filaments, plasmas, or gases. LEDs include semiconductor LEDs, PLEDs (polymer light emitting diodes), OLEDs (organic light emitting diodes), and/or other types of solid state devices that convert electrical energy into electromagnetic radiation in a desired spectrum. In some embodiments, SST dies can include solid-state devices that convert electromagnetic radiation into electricity. A person skilled in the relevant art will also understand that the technology may have additional embodiments, and that the technology may be practiced without several of the details of the embodiments described below with reference to FIGS. 4A-6.

Briefly described, several embodiments of SST dies and devices having SST dies disclosed below improve the emitting efficiency compared to the conventional devices described above with reference to FIGS. 1A-3C. When energized, the active material of the SST emits light, but a portion of the light refracts or reflects back toward the SST die from either the converter material or the interface between the lens and air. The electrical contacts on the conventional SST dies absorb the returned light, which reduces the light output and creates an appearance of undesirable dark areas on the surface of the SST die. To resolve this problem, several embodiments of the present technology have a reflective material over, covering, or otherwise proximate to at least a portion of selected electrical contacts to reflect the returned light away from the electrical contacts. For example, depending on the orientation of the die, the reflective material can be on, above (upward facing dies), below (downward facing dies), and/or around the selected electrical contacts. This reduces absorption of the light by the contacts and concomitantly increases the efficiency and enhances the visual appearance of the SST die.

Figure 4A:
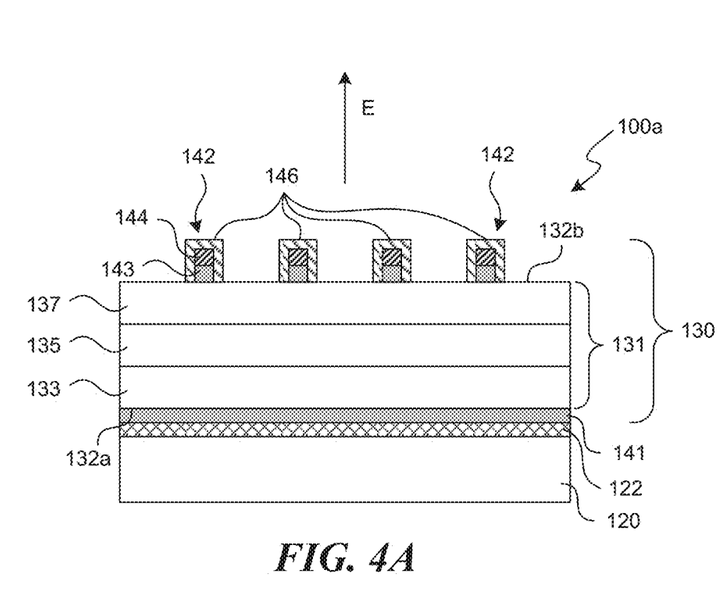
FIG. 4A is a partially schematic, cross-sectional illustration of an SST die in accordance with an embodiment of the presently disclosed technology.

FIG. 4A illustrates an SST die 100a in accordance with embodiments of the presently disclosed technology. The SST die 100a can have a support substrate 120 and an SST 130 attached to the support substrate 120 using a bond material 122. The SST 130 can have a transduction structure 131 that includes an active material 135 (e.g., gallium nitride/indium gallium nitride (GaN/InGaN) having multiple quantum wells) between a first semiconductor material 133 (e.g., P-type GaN) defining a back side 132a of the transduction structure 131 and a second semiconductor material 137 (e.g., N-type GaN) defining a front side 132b of the transduction structure 131. In general, the front side 132b faces in the direction E that light or other radiation passes from and/or to the SST 130, while the back side 132a faces toward the support substrate 120. The SST 130 can further include a first connector 141 (e.g., P-type connector) at the back side 132a of the transduction structure 131 and one or more second connectors 142 (e.g., N-type connectors) at the front side 132b of the transduction structure 131. The second connectors 142 can be, for example, elongated rails or distributed dots disposed over the front side 132b of the SST 130. The layout and shape of the second connectors 142 is selected to distribute electrical current flow through the transduction structure 131. The bond material 122 can be a stack of Ni and Sn materials. Other bond materials are also possible. The illustrated support substrate 120 has the same width as the SST 130, i.e., the sides of the support substrate 120 are aligned with the sides of the SST 130, but the support substrate 120 can also be wider and deeper than the outline of the SST 130.

The second connectors 142 can include a base material 143 on the second semiconductor material 137 and a current spreading material 144 on the base material 143. The second connectors 142 can further include a reflective material 146 over (e.g., on, covering, around and/or otherwise proximate to) the base material 143 and the current-spreading metal 144. In some embodiments of the SST die 100a, the second connectors 142 do not include the current spreading material 144 such that the reflective material 146 directly contacts the base material. The reflective material 146 can be deposited over the base material 143 and/or over the current-spreading material 144 using vacuum evaporation, sputtering, or chemical vapor deposition or other suitable processes known in the art.

The base material 143 and/or the current spreading material 144 of the second connectors 142 can have a first reflectivity. The base material 143, for example, can be a titanium-aluminum alloy, other alloys of aluminum, aluminum, and/or other suitable conductive materials. The current spreading material 144 should have good electrical conductivity and avoid adverse interaction with the base material 143 and the reflective material 146. The current spreading material 144, for example, can be gold. The reflective material 146 can have a second reflectivity greater than the first reflectivity of the base material 143 and/or the current spreading material 144. The reflective material 146, for example, can be silver, a silver alloy, aluminum, polished metals, or other materials having high a reflectivity. The first connector 141, which can be a P-type connector, should also have a high reflectivity to reflect the emitted and the returned light away from the first connector 141. The first connector 141, for example, can also be silver or a silver alloy.

Figure 4B:
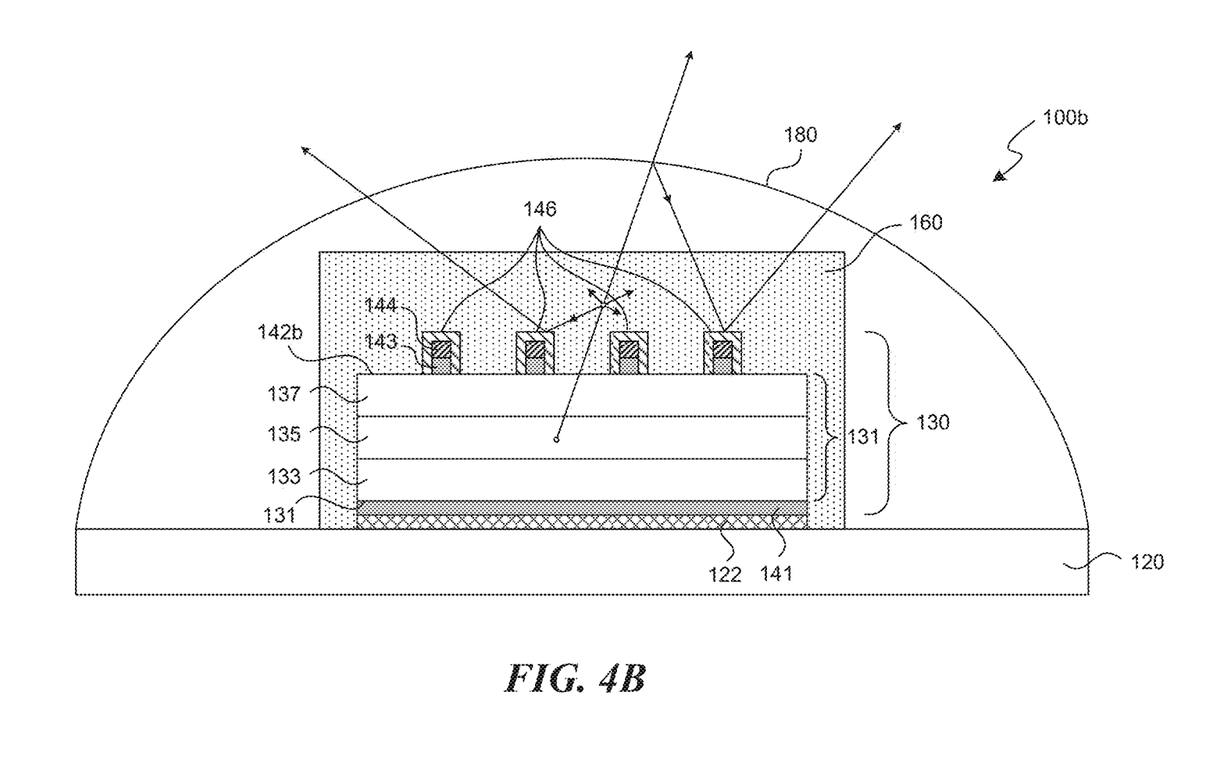
FIG. 4B is a partially schematic, cross-sectional illustration of a packaged SST device with a lens in accordance with an embodiment of the presently disclosed technology.

FIG. 4B illustrates a packaged SST device 100b that includes the SST die 100a, a converter material 160 over the SST die 100a, and a lens 180 over the converter material 160. In operation, a portion of the light scattered/reflected from the converter material 160 and/or the lens 180 returns toward the SST 130 and impinges either on the reflective material 146 or the active material 130. The reflective material 146 reflects most of the light away from the front side 132b of the transduction structure 130 such that the additional reflected light increases the overall efficiency of the SST die 100a compared to conventional devices without the reflective material 146. Furthermore, the second connectors 142 do not appear as dark compared to the connectors in conventional configurations without the reflective material 146.

Figure 5A:
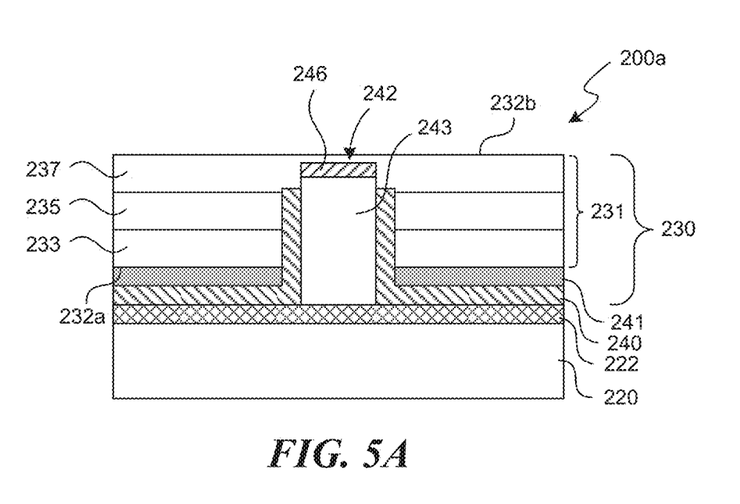
FIGS. 5A and 5B are partially schematic, cross-sectional illustrations of SST dies in accordance with another embodiment of the presently disclosed technology.

FIG. 5A illustrates an SST die 200a in accordance with another embodiment of the presently disclosed technology. The SST die 200a is similar to the embodiments described in conjunction with FIGS. 4A-4B, but the SST die 200a has a buried contact. In the illustrated embodiment, the SST die 200a has an SST 230 with a transduction structure 231 including an active material 235 between a first semiconductor material 233 and a second semiconductor material 237. The first semiconductor material 233 may be a P-type GaN and the second semiconductor material 237 may be an N-type GaN, or alternatively the first semiconductor material 233 may be an N-type GaN and the second semiconductor material 237 may be a P-type GaN.

The SST 230 also has a first connector 241 at a back side 232a of the transduction structure 231 and a second connector 242 buried in the transduction structure 231 under a front side 232b of the transduction structure 231. The first connector 241 can be a P-type connector electrically coupled to the P-type first semiconductor material 233, and the second connector 242 can be an N-type connector electrically coupled to the second semiconductor material 237. The second connector 242 can include a conductive base material 243 having a first reflectivity and a reflective material 246 having a second reflectivity over (e.g., on, covering and/or at least proximate to) at least a portion of the base material 243 that faces the front side 232b of the SST 230. The second reflectivity of the reflective material 246 is greater than the first reflectivity of the base material 243.

The SST 230 further includes an insulation material 240 electrically separating the base material 243 of the second connector 242 from the active material 235, the first semiconductor material 233, and the first connector 241. Suitable insulation materials include, for example, ceramics, oxides, polymers, epoxies, and other dielectric materials know to persons skilled in the art. The SST 230, which includes the transduction structure 231, the first connector 241, the second connector 242, and the insulation material 240, can be bonded to a support substrate 220 by a bond material 222. The support substrate 220 and the bond material 222 can be similar to those described in reference to FIGS. 4A-4B.

In operation, an electrical current flowing through the first and the second connectors 241 and 242 causes the transduction structure 231 to emit light. A portion of the emitted light refracts/reflects back toward the reflective material 246, which in turn reflects this light away from the SST 230. The SST 230 with the reflective cover 246 accordingly improves the output efficiency and reduces dark areas compared to configurations without the reflective material 246.

Figure 5B:
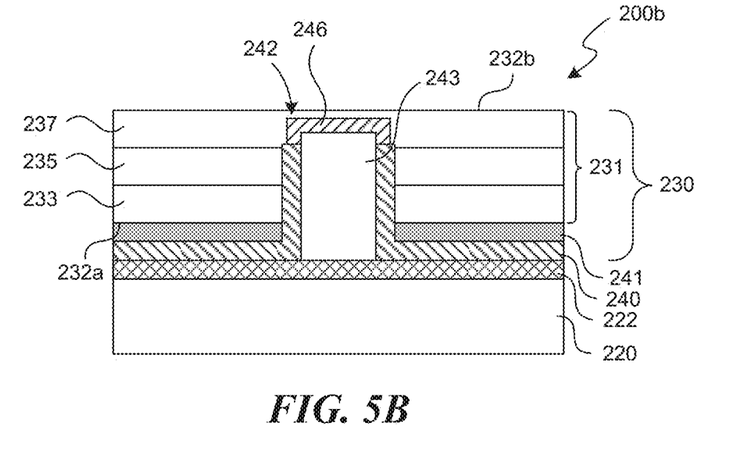

FIG. 5B illustrates an SST die 200b in accordance with another embodiment of the presently disclosed technology. Here, the reflective material 246 completely covers the portion of the second connector 242 in electrical contact with the second semiconductor material 237. For example, the side and top surfaces of the upper portion of the second connector 242 can be coated by the reflective materials 246. The increased coverage of the second connector 242 by the reflective material 246 can further increase the amount of light emitted by the device.

Figure 6:
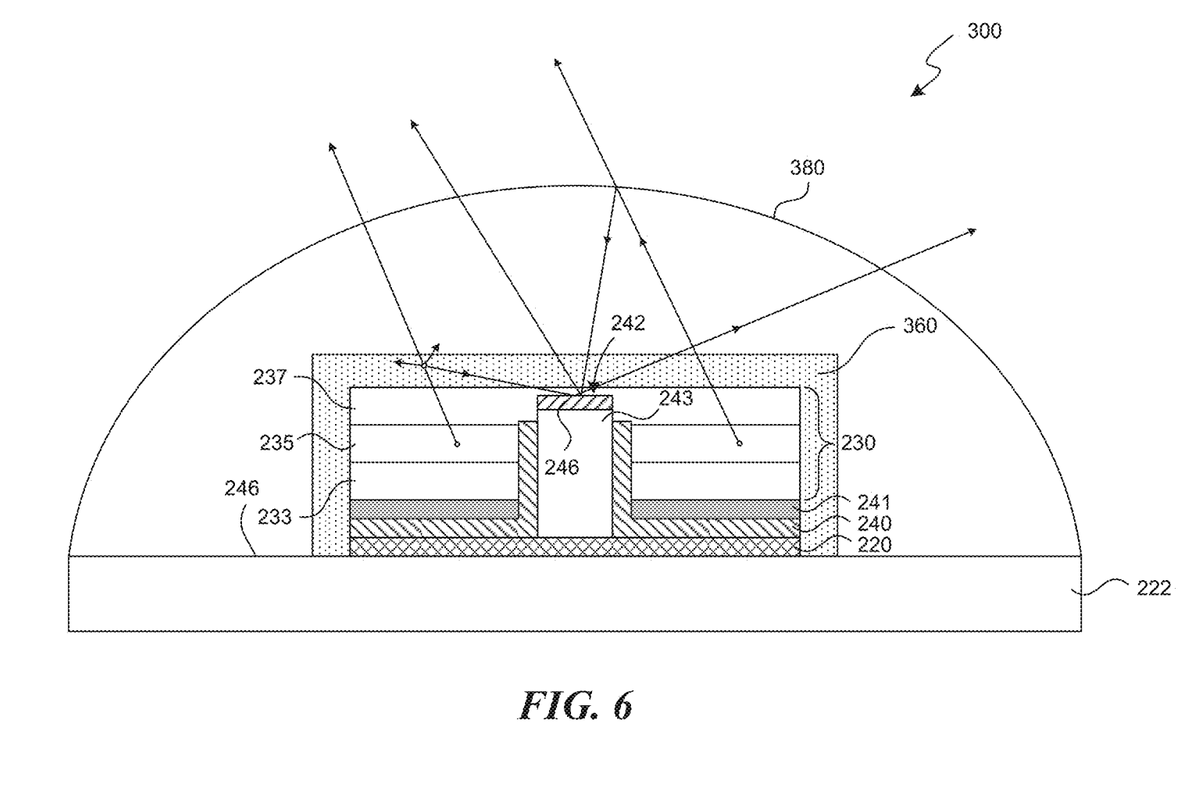
FIG. 6 is a partially schematic, cross-sectional illustration of a packaged SST device with a lens in accordance with another embodiment of the presently disclosed technology.

FIG. 6 illustrates an SST device 300 having the SST die 200a of FIG. 5A, a converter material 360, and a lens 380. In operation, a portion of the light emitted from the active material 235 can scatter from the converter material 60 or reflect from the edge of the lens 80. The scattered/reflected light reflects from the reflective material 246, and as described above, the higher reflectivity of the reflective material 246 increases the amount of light that is emitted by the SST device 300.

From the foregoing, it will be appreciated that specific embodiments of the technology have been described herein for purposes of illustration, but that various modifications may be made without deviating from the disclosure. For example, different materials can be used for SST devices and/or the substrates in further embodiments. Furthermore, the structures of the devices may differ from those shown in the Figures. For example, several SST dies can be combined into one SST device and/or one package. The reflective material can be used to at least partially cover the substrate carrier to further increase overall amount of the light reflected outside of the SST die. In at least some embodiments, the insulation material facing toward outside of the SST die can be partially covered with the reflective material, while preserving the function of the insulation material. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Accordingly, the disclosure can encompass other embodiments not expressly shown or described herein.

We claim:
1. A light emitting diode (LED), comprising:
   a transduction structure including a back side, a front side opposite the back side, a first semiconductor material having a surface at the back side, a second semiconductor material having a surface at the front side, and a light-emitting active material between the first and second semiconductor materials; and
   an electrical connector including:
      a base material extending from the back side of the transduction structure through the first semiconductor material and the active material to the second semiconductor material, the base material electri- cally isolated from the first semiconductor material and from the active material, the base material electrically coupled to the second semiconductor material, the base material having a top side facing the front side of the transduction structure, and a reflective material disposed between at least a portion of the base material nearest the front side of the transduction structure and the second semiconductor material, wherein the reflective material covers at least a portion of the top side of the base material.

2. The LED of claim 1 wherein the reflective material has a higher reflectivity than the base material.

3. The LED of claim 1 wherein the portion of the base material is disposed within the second semiconductor material.

4. The LED of claim 1 wherein the base material is at least one of a Ti—Al alloy and Al, and the reflective material is at least one of Al, Ag or an Ag alloy.

5. The LED of claim 1 wherein the base material comprises:

a lateral side facing an insulation material, wherein the reflective material covers at least a portion of the lateral side of the base material.

6. The LED of claim 1, wherein the reflective material coats all portions of the electrical connector in electrical contact with the second semiconductor material.

7. A light emitting diode (LED) device, comprising:

a support substrate; and an LED die on the support substrate, the LED die including:

a back side facing the support substrate, a front side opposite the back side, a first semiconductor material having a first surface at the back side, a second semiconductor material having a second surface at the front side, and a light-emitting active material between the first and second semiconductor materials; and an electrical connector comprising:

a base material extending from the back side of the LED die through the first semiconductor material and the active material to the second semiconductor material, the base material electrically isolated from the first semiconductor material and from the active material, the base material electrically coupled to the second semiconductor material, the base material having a top side facing the front side of the transduction structure, and a reflective material disposed between at least a portion of the base material nearest the front side of the LED die and the second semiconductor material, wherein the reflective material covers at least a portion of the top side of the base material.

8. The LED device of claim 7 wherein the reflective material has a higher reflectivity than the base material.

9. The LED device of claim 7 wherein the portion of the base material is disposed within the second semiconductor material.

10. The LED device of claim 7, the LED die further comprising a converter material disposed at least partially around the active semiconductor material.

11. The LED device of claim 7, the LED die further comprising a lens forming a cavity for housing at least the LED die.

12. The LED device of claim 7, wherein the reflective material coats all portions of the electrical connector in electrical contact with the second semiconductor material.

13. A method of manufacturing a light emitting diode (LED) die, the method comprising:

forming a transduction structure having a back side, a front side opposite the back side, a first semiconductor material having a first surface at the back side, a second semiconductor material having a second surface at the front side, and a light-emitting active material between the first and second semiconductor materials;

forming an electrical connector electrically coupled to the second semiconductor material by:

constructing a buried contact having a base material extending from the back side of the transduction structure through the first semiconductor material and the active material to the second semiconductor material, the base material electrically coupled to the second semiconductor material, the base material having a top side facing the front side of the transduction structure, and depositing a reflective material between at least a portion of the base material nearest the front side of the transduction structure and the second semiconductor material such that the reflective material covers at least a portion of the top side of the base material; and disposing an insulation material electrically separating the electrical connector and at least one of the first semiconductor material and the active material.

14. The method of claim 13 wherein disposing the insulation material comprises electrically separating the electrical connector and each of the first semiconductor material and the active material.

15. The method of claim 13 wherein the base material is at least one of a Ti—Al alloy and Al, and the reflective material is at least one of Al, Ag or an Ag alloy.

16. The method of claim 13, wherein the reflective material coats all portions of the electrical connector in electrical contact with the second semiconductor material.

* * * * *